(12) United States Patent
Xu et al.

(10) Patent No.: US 8,334,205 B2
(45) Date of Patent: Dec. 18, 2012

(54) METHOD FOR REMOVING POLYMER AFTER ETCHING GATE STACK STRUCTURE OF HIGH-K GATE DIELECTRIC/METAL GATE

(75) Inventors: Qiuxia Xu, Beijing (CN); Yongliang Li, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/130,514

(22) PCT Filed: Feb. 15, 2011

(86) PCT No.: PCT/CN2011/070996
§ 371 (c)(1),
(2), (4) Date: May 20, 2011

(87) PCT Pub. No.: WO2012/062059
PCT Pub. Date: May 18, 2012

(65) Prior Publication Data
US 2012/0115321 A1 May 10, 2012

(30) Foreign Application Priority Data
Nov. 10, 2010 (CN) .......................... 2010 1 0541134

(51) Int. Cl.
*H01L 21/44* (2006.01)
(52) U.S. Cl. ................. 438/656; 438/591; 257/E21.219
(58) Field of Classification Search ........... 257/E21.051, 257/E21.177, E21.4, E21.457, E21.483
See application file for complete search history.

(56) References Cited

U.S. PATENT DOCUMENTS

| 6,110,834 A | 8/2000 | Kinoshita et al. |
| 2007/0051700 A1* | 3/2007 | Lee et al. .......................... 216/83 |
| 2007/0184996 A1 | 8/2007 | Weng et al. |
| 2011/0294274 A1* | 12/2011 | Hsu et al. ...................... 438/299 |

FOREIGN PATENT DOCUMENTS

| CN | 1645259 A | 7/2005 |
| CN | 101339903 A | 1/2009 |
| CN | 101412948 A | 4/2009 |
| CN | 101523297 A | 9/2009 |

OTHER PUBLICATIONS

International Search Report and Written Opinion in foreign counterpart Application No. PCT/CN2011/070996, dated Aug. 18, 2011.

* cited by examiner

*Primary Examiner* — Cheung Lee
(74) *Attorney, Agent, or Firm* — Kinney & Lange, P.A.

(57) ABSTRACT

The present invention provides a method for removing polymer after etching a gate stack structure of high-K gate dielectric/metal gate. The method mainly comprises the following steps: 1): forming a gate stack structure of interface $Si_2$/high-K gate dielectric/metal gate/poly-silicon/hard mask in sequence on a silicon substrate with device isolations formed thereon; 2): forming a resist pattern by the lithography; 3): etching the gate stack structure; and 4): immersing the resultant structure of the step 3) in an etching solution to remove the polymer, wherein the etching solution consists of HF, HCl and water, the ratio of HF by volume is 0.2~1% and the ratio of HCl by volume is 5~15%.

11 Claims, 1 Drawing Sheet

METHOD FOR REMOVING POLYMER AFTER ETCHING GATE STACK STRUCTURE OF HIGH-K GATE DIELECTRIC/METAL GATE

CROSS REFERENCE TO RELATED APPLICATION(S)

This application is a section 371 National Phase Application of International Application No. PCT/CN2011/070996, filed on Feb. 15, 2011, which claims priority to CN 201010541134.6, filed on Nov. 10, 2010, the entire contents of which are incorporated herein by reference in their entirety.

FIELD OF THE INVENTION

The invention relates to the nanometer-scale semiconductor field and particularly to a method for removing polymer after etching a stack structure of high-K (high dielectric constant) gate dielectric/metal gate in the gate-first process. The present invitation applies to the manufacture of complementary metal oxide semiconductor devices and circuits at the technology generation of 45 nm and below.

DESCRIPTION OF THE PRIOR ART

As the feature size of devices has been reduced to 45 nm or even smaller, there is an inevitable trend to replace the conventional gate structure of $SiO_2$/polysilicon is with the stack structure of high-K gate dielectric/metal gate. Meanwhile, the stack structure of high-K gate dielectric/metal gate significantly reduces the large gate leakage current which would occur for the conventional gate structure of $SiO_2$/polysilicon, eliminates the depletion effect of the polysilicon gate and reduces the gate resistance. However, it has been found that in the gate-first process, after the stack structure of high-K gate dielectric/metal gate is etched, there will be a polymer layer remained on both sides of the gate stack and also on a surface of the silicon substrate. The polymer layer should be removed to avoid negative effects on the performance of the devices and the circuits. However, there has been no public report on the removal of the polymer after the etching of the gate stack structure in the gate-first process.

SUMMARY OF THE INVENTION

An object of the present invention is to provide a method for removing polymer after etching a gate stack structure of high-K gate dielectric/metal gate, by which it is possible not only to keep a vertically etched profile of the gate stack, but also to completely remove the polymer remained on both sides of the gate stack and on a surface of the silicon substrate without damaging the silicon substrate. The method is well compatible with the CMOS processes and is cost efficient.

To achieve the object above, there is provided a method for removing polymer after etching a gate stack structure of high-K gate dielectric/metal gate, wherein HCl is added in a dilute HF solution to suppress corrosion to the field $SiO_2$, and facilitate the removal of the polymer. The method mainly comprises the following steps:

step 1): forming a gate stack structure of interface $SiO_2$/high-K gate dielectric/metal gate/poly-silicon/hard mask in sequence on a silicon substrate with device isolations formed thereon;
step 2): forming a resist pattern by photo-lithography;
step 3): etching the gate stack structure; and
step 4): immersing the resultant structure of step 3) in an etching solution of HF/HCl/water to remove the polymer, wherein in the etching solution the ratio of HF by volume is 0.2~1% and the ratio of HCl by volume is 5~15%.

Preferably, in step 1) the high-K gate dielectric is Hf-base doped oxide, such as $HfO_2$, HfSiON, HfSiO, HfLaO, HfLaON, HfAlON, or HfSiAlON, etc.

Perferably, in step 1) the metal gate comprises metal nitride or doped refractory metal, such as TaN, TiN, TaC, TaCN, MoAlN, TiAlN, TiGaN, or MoAlN, etc.

Preferably, in step 1) the hard mask comprises $SiO_2$, $Si_3N_4$, or a combination thereof.

Preferably, in step 3), the hard mask is etched by a F-base gas $CF_4/CHF_3$, the poly-silicon is etched by a mixed gas of $Cl_2$/HBr, the metal gate is etched by a Cl-base reactive ion etch using a mixed gas such as $BCl_3/Cl_2$/Ar or $BCl_3/Cl_2/SF_6$/Ar, and the high-K gate dielectric is etched by a $BCl_3$-base gas.

Preferably, in step 4), the resultant structure of step 3) is immersed in the etching solution under the room temperature for 10~120 seconds while the etching solution is stirred.

DETAILED DESCRIPTION OF THE PREFERRED EMBODIMENTS

The following examples are provided only for explaining the present invention rather than limiting the scope thereof.

step 1), a stack structure of interface $SiO_2$/high-K gate dielectric/metal gate/poly-silicon/hard mask is formed in sequence on a silicon substrate with device isolations formed thereon, wherein the high-K gate dielectric is Hf-base doped oxide, such as $HfO_2$, HfSiON, HfSiO, HfLaO, HfLaON, HfAlON, or HfSiAlON, etc., the metal gate comprises metal nitride or doped refractory metal, such as TaN, TiN, TaC, TaCN, MoAlN, TiAlN, TiGaN, or MoAlN, etc., and the hard mask comprises $SiO_2$, $Si_3N_4$ or a combination thereof.

step 2), a resist pattern is formed by optical or electron beam lithography.

step 3), the gate stack structure is etched by reactive ion etch, wherein the hard mask is etched by a F-base gas such as $CF_4/CHF_3$, the polysilicon is etched by a mixed gas of $Cl_2$/HBr, the metal gate is etched by a Cl-base reactive ion etch using mixed gas such as $BCl_3/Cl_2$/Ar or $BCl_3/Cl_2/SF_6$/Ar, and the high-K gate dielectric is etched by a $BCl_3$-base gas.

step 4), the polymer is removed by wet chemical etching, wherein the etching solution consists of HF, HCl and water, the ratio of HF by volume is 0.2~1% and the ratio of HCl by volume is 5~15%. The resultant structure of step 3) is immersed into the etching solution under the room temperature for 10~60 seconds while the etching solution is stirred to achieve a good uniformity.

Figure 1:
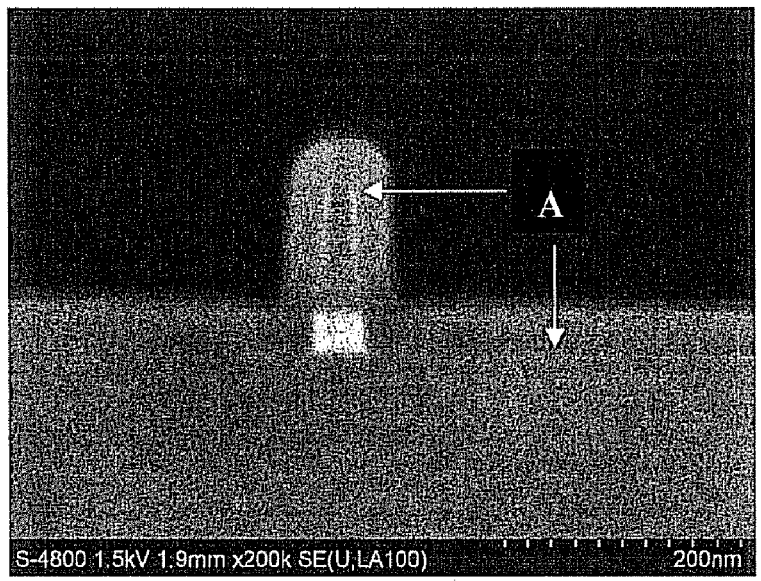
FIG. 1 is a SEM photo of a gate stack profile after the gate stack is etched and before the polymer is removed. The remained polymer (the white thin deposition layer indicated by an arrow A) is obvious at both sides of the gate stack and on the surface of the silicon substrate.
Figure 2:
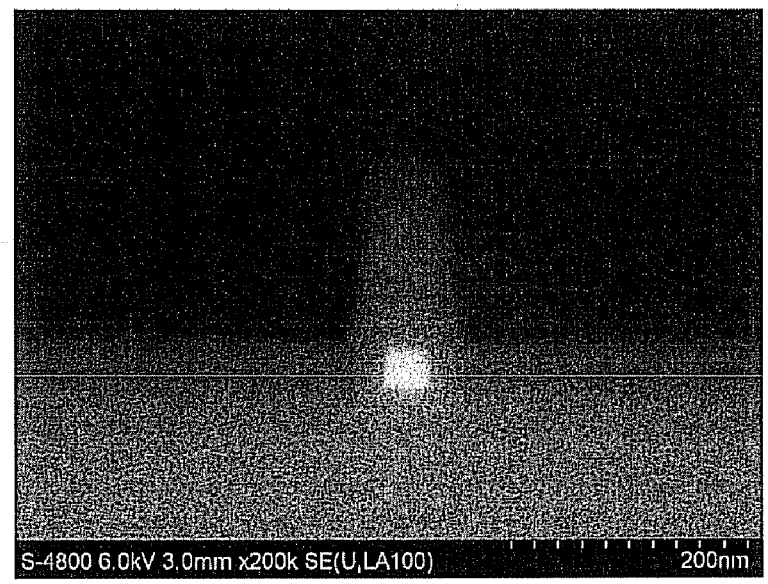
FIG. 2 is a SEM photo of a gate stack profile after the gate stack structure is etched and then the polymer is removed.

A comparison between FIG. 1 and FIG. 2 shows the effect of the removing of the remained polymer according to the present invention. FIG. 2 shows that the polymer at both sides of the gate stack and on the surface of the silicon substrate has been completely removed while the etch profile is still vertical and the silicon surface is smooth without damage.

What is claimed is:

1. A method for removing polymer after etching a gate stack structure of high-K gate dielectric/metal gate, comprising:

step 1): forming a gate stack structure of interface $SiO_2$/high-K gate dielectric/metal gate/poly-silicon/hard mask in sequence on a silicon substrate with device isolations formed thereon;

step 2): forming a resist pattern by the lithography;

step 3): etching the gate stack structure; and step 4): immersing the resultant structure of step 3) in an etching solution of HF/HCl/water to remove the polymer, wherein in the etching solution the ratio of HF by volume is 0.2~1% and the ratio of HCl by volume is 5~15%.

2. The method according to claim 1, wherein in step 1) the high-K gate dielectric is Hf-base doped oxide.

3. The method according to claim 2, wherein the high-K gate dielectric comprises $HfO_2$, HfSiON, HfSiO, HfLaO, HfLaON, HfAlON, or HfSiAlON.

4. The method according to claim 1, wherein the high-K gate dielectric comprises $HfO_2$, HfSiON, HfSiO, HfSiON, HfLaO, HfLaON, HfAlON, or HfSiAlON.

5. The method according to claim 1, wherein in step 1) the metal gate comprises metal nitride or doped refractory metal.

6. The method according to claim 5, wherein the metal gate comprises TaN, TiN, TaC, TaCN, MoAlN, TiAlN, TiGaN, or MoAlN.

7. The method according to claim 1, wherein the metal gate comprises TaN, TiN, TaC, TaCN, MoAlN, TiAlN, TiGaN, or MoAlN.

8. The method according to claim 1, wherein in step 1) the hard mask comprises $SiO_2$, $Si_3N_4$, or a combination thereof.

9. The method according to claim 1, wherein in step 3), the hard mask is etched by a F-base gas $CF_4/CHF_3$, the poly-silicon is etched by a mixed gas of $Cl_2$/HBr, the metal gate is etched by a Cl-base reactive ion etching, and the high-K gate dielectric is etched by a $BCl_3$-base gas.

10. The method according to claim 9, wherein a mixed gas of $BCl_3/Cl_2$/Ar or $BCl_3/Cl_2/SF_6$/Ar is used in the Cl-base reactive ion etching.

11. The method according to claim 1, wherein in step 4), the resultant structure of step 3) is immersed in the etching solution under the room temperature for 10~120 seconds while the etching solution is stirred.

* * * * *